United States Patent [19]
Broschard, III et al.

[11] Patent Number: 5,389,001
[45] Date of Patent: Feb. 14, 1995

[54] CARD EJECTING MECHANISM

[75] Inventors: John L. Broschard, III, Harrisburg; Donald E. Dellinger, Hellam, both of Pa.

[73] Assignee: The Whitaker Corporation, Wilmington, Del.

[21] Appl. No.: 200,847

[22] Filed: Feb. 22, 1994

Related U.S. Application Data

[63] Continuation of Ser. No. 8,939, Jan. 26, 1993, abandoned, which is a continuation-in-part of Ser. No. 926,628, Aug. 10, 1992, Pat. No. 5,318,452.

[51] Int. Cl.⁶ .......................................... H01R 13/62
[52] U.S. Cl. ............................... 439/159; 439/64
[58] Field of Search ................ 439/64, 59, 101, 108, 439/152, 153, 155, 159, 160, 377

[56] References Cited

U.S. PATENT DOCUMENTS

| | | | |
|---|---|---|---|
| 3,453,586 | 7/1969 | Brendlen, Jr. | |
| 4,875,873 | 10/1989 | Ishizuka et al. | 439/347 |
| 4,952,161 | 8/1990 | Komatsu | 439/155 |
| 5,000,694 | 3/1991 | Komatsu | 439/260 |
| 5,011,420 | 4/1991 | Sakomoto | 439/152 |
| 5,026,296 | 6/1991 | Hashiguchi | 439/159 |
| 5,033,972 | 7/1991 | Komatsu et al. | 439/153 |
| 5,051,101 | 9/1991 | Komatsu | 439/159 |
| 5,065,004 | 11/1991 | Mizuno et al. | 235/479 |
| 5,067,041 | 11/1991 | Cooke et al. | 439/108 X |
| 5,145,389 | 9/1992 | Okubo | 439/159 |
| 5,149,276 | 9/1992 | Dixon | 439/159 |
| 5,152,697 | 10/1992 | Abe et al. | 439/152 |
| 5,161,289 | 11/1992 | Okubo et al. | 439/159 |

FOREIGN PATENT DOCUMENTS

| | | | |
|---|---|---|---|
| 1-132074 | 9/1989 | Japan | 13/629 |
| 2-24481 | 2/1990 | Japan | 23/68 |
| 2-52280 | 4/1990 | Japan | 13/639 |
| 3-39266 | 4/1991 | Japan | 13/629 |
| 3-79177 | 8/1991 | Japan | 13/652 |

*Primary Examiner*—Khiem Nguyen

[57] ABSTRACT

A card ejecting mechanism with ESD protection, comprising: a sliding tray (36) between guide arms (5, 6) spaced apart to receive opposite side edges of a card (73), the guide arms (5, 6) being connected to an electrical connector (1), a lever arm (37) pivotally attached to the tray (36), a push button (38) slidably engaging the lever arm (37), a housing (39) mounting the button (38) slidably on one of the rails (5, 6), the tray (36) being engaged and moved by the lever arm (37) to urge the card (73) outwardly from the rails (5, 6) and conductive fingers (54, 68) on the tray (36) projecting to contact the card (73) received by the guide arms (5, 6).

15 Claims, 8 Drawing Sheets

CARD EJECTING MECHANISM

This application is a continuation of application Ser. No. 08/008,939, filed Jan. 26, 1993, now abandoned, in turn, a continuation-in-part of application Ser. No. 07/926,628, filed Aug. 10, 1992, now Pat. No. 5,318,452.

CROSS REFERENCE TO RELATED APPLICATION

FIELD OF THE INVENTION

The invention relates to a card ejecting mechanism for ejecting a memory card from an electrical connector of a card reader.

BACKGROUND OF THE INVENTION

A known card ejecting mechanism, disclosed in U.S. Pat. No. 4,952,161, comprises, a conductive plate bridging between guide arms spaced apart to receive opposite side edges of a card, the guide arms being connected to an electrical connector, a lever arm pivotally attached to the plate, a push button slidably engaging the lever arm, a housing mounting the button slidably on one of the rails, and a sliding tray engaged and moved by the lever to urge the card outwardly from the rails for grasping to remove the card from the rails.

SUMMARY OF THE INVENTION

The present invention resides in a card ejecting mechanism for ejecting a card from an electrical connector, wherein, the ejecting mechanism is adapted to be mounted to one side or the other with respect to a card guiding device. The invention further pertains to a card ejecting mechanism adapted to engage a card and to provide ESD protection, electrostatic discharge protection, and EMI protection, electromagnetic interference protection, for the card. The ESD and EMI protection is supplied by at least one conductive finger that engages the card when the card is inserted along a card guiding device. The first conductive finger is positioned to avoid engagement with moving parts of the ejecting mechanism when the ejecting mechanism is mounted to one side of the guiding device. When the ejecting mechanism is mounted to another side of the guiding device, the first conductive finger is removed to avoid engagement with moving parts of the ejecting mechanism, and a second conductive finger is used for engaging the card. The second conductive finger is removed when the first conductive finger is being used to provide the ESD protection.

According to an advantage of the invention, a card ejecting mechanism is constructed to be mounted to one side or the other of a card receiving mechanism of a card reader. According to another advantage of the invention, conductive fingers of a card ejecting mechanism provides ESD protection for a card, and either one or the other of the fingers is removable to avoid engagement with moving parts of the mechanism that is mounted to one side or the other of a card receiving mechanism.

DESCRIPTION OF THE DRAWINGS

Embodiments of the invention will now be described by way of example with reference to the accompanying drawings in which.

FIGS. 7 and 9 are section views of mounting structure on a housing and a guide rail.

DETAILED DESCRIPTION

Figure 1:
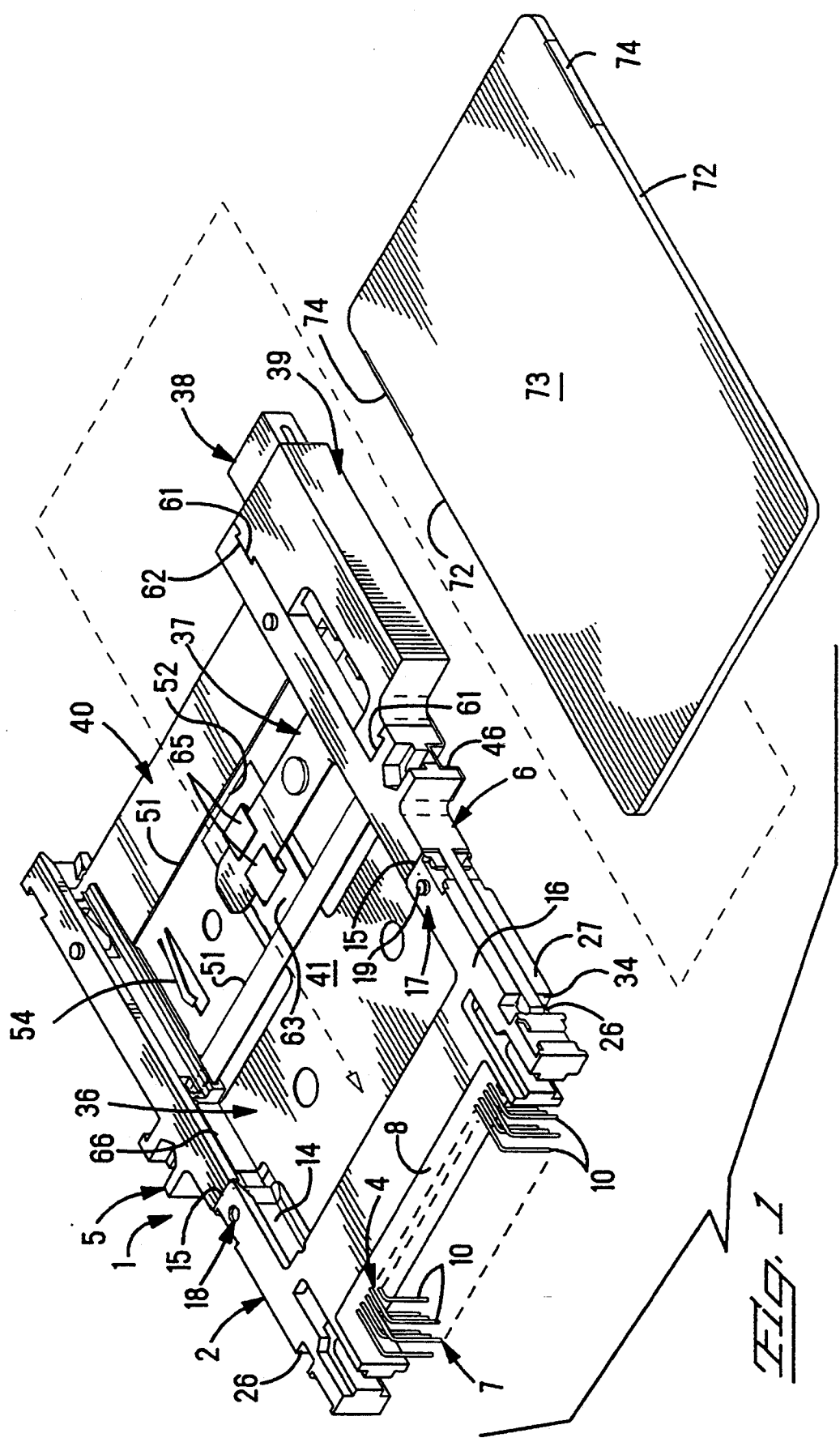
FIG. 1 is a perspective view of an electrical connector and a card guiding device, together with a card eject mechanism.

With reference to FIG. 1, an electrical connector 1, especially suitable for use in a card reader, not shown, includes an insulating housing 2 having a card receiving mouth 3, multiple electrical contacts 4 held by the housing 2 extending in two rows and into the mouth 3, and a set of card guide arms 5, 6.

With reference to FIG. 1, tail sections 7 of the contacts 4 extend outwardly of a rear surface 8 of the housing 2 for connection to a circuit board, not shown. Feet 10 on free ends of the contacts 4 are adapted with respective shapes for connection to the circuit board. For example, the feet 10 are shaped as posts for insertion into plated apertures of the circuit board, not shown. Alternatively, the feet 10 can be shaped as surface mount flat portions, not shown, for connection to surface mount pads, not shown, on a circuit board. The housing 2 has starter grooves 14 in forwardly projecting housing arms 15 on opposite sides of the mouth 3. A top surface 16 of each housing 2 has a locking structure 17 in the form of a recess 18 on one side flanking the mouth 3, and a projecting knob 19 in another side flanking the mouth 3. The card receiving mouth 3 is adapted to receive a card 73, FIG. 1, known in the industry, and disclosed, for example, in U.S. Pat. No. 5,033.972. A conductive ground plane 74 on an exterior of the memory card extends along edges 72 of the card 73, and provides a conductive shield that protects circuitry and electronics in the memory card 73 from electrical influences due to electromagnetic interference, EMI, and electrostatic discharge, ESD.

Figure 2:
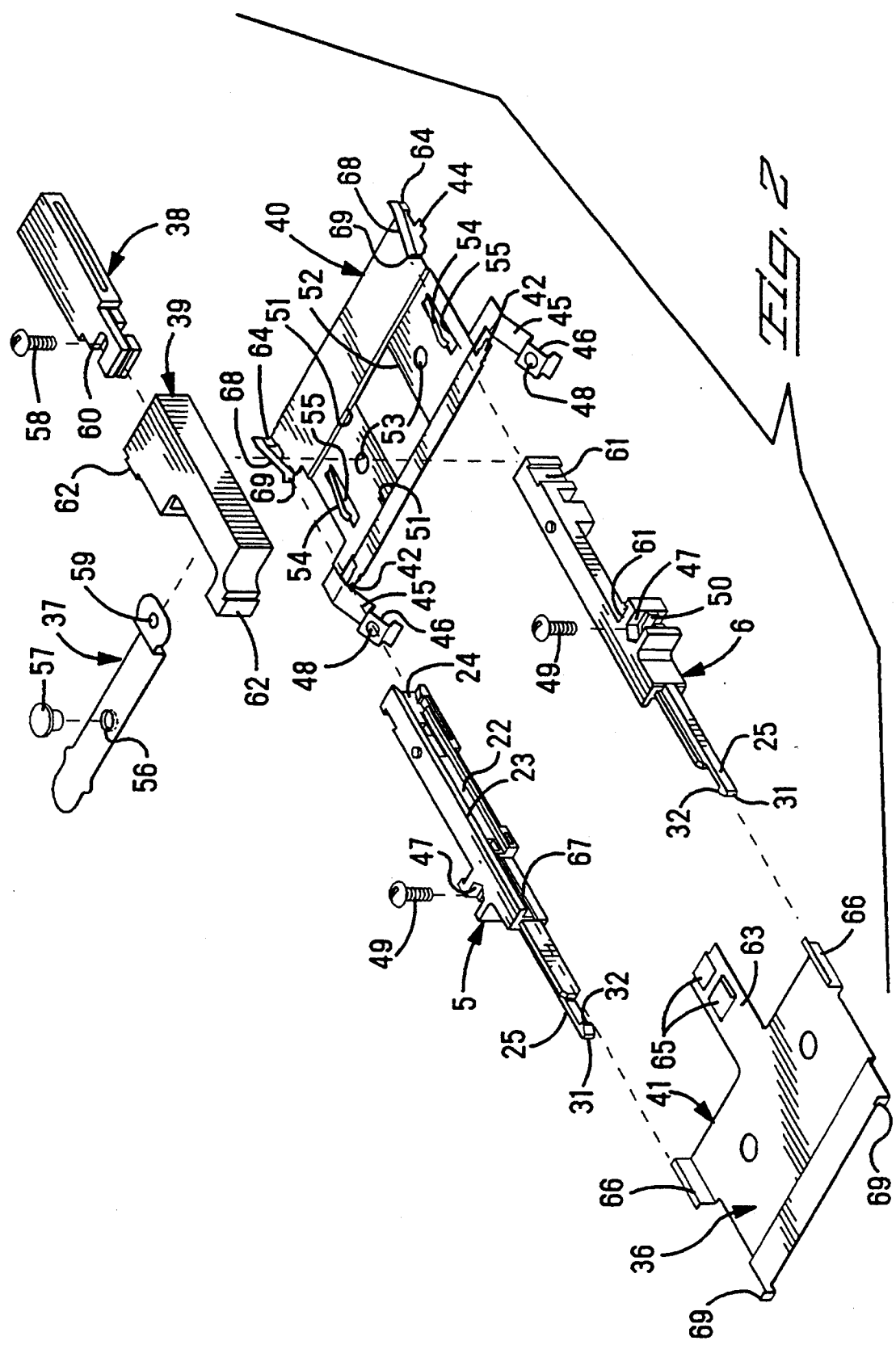
FIG. 2 is a perspective view of the structure shown in FIG. 1 with the component parts separated from one another.

The guide arms 5, 6 are of unitary construction molded from a thermoplastic material. The guide arm 5, 6 are constructed with similar features that will now be described. FIG. 2, card receiving grooves 22 on inside surfaces 23 extend along lengths of the respective guide arms 5, 6. Flared, groove mouths 24 at respective ends of the guide arms 5, 6 open into respective grooves 22 of the guide arms 5, 6. At opposite ends of respective guide arms 5, 6, respective elongated prongs 25 extend outwardly.

Figure 3:
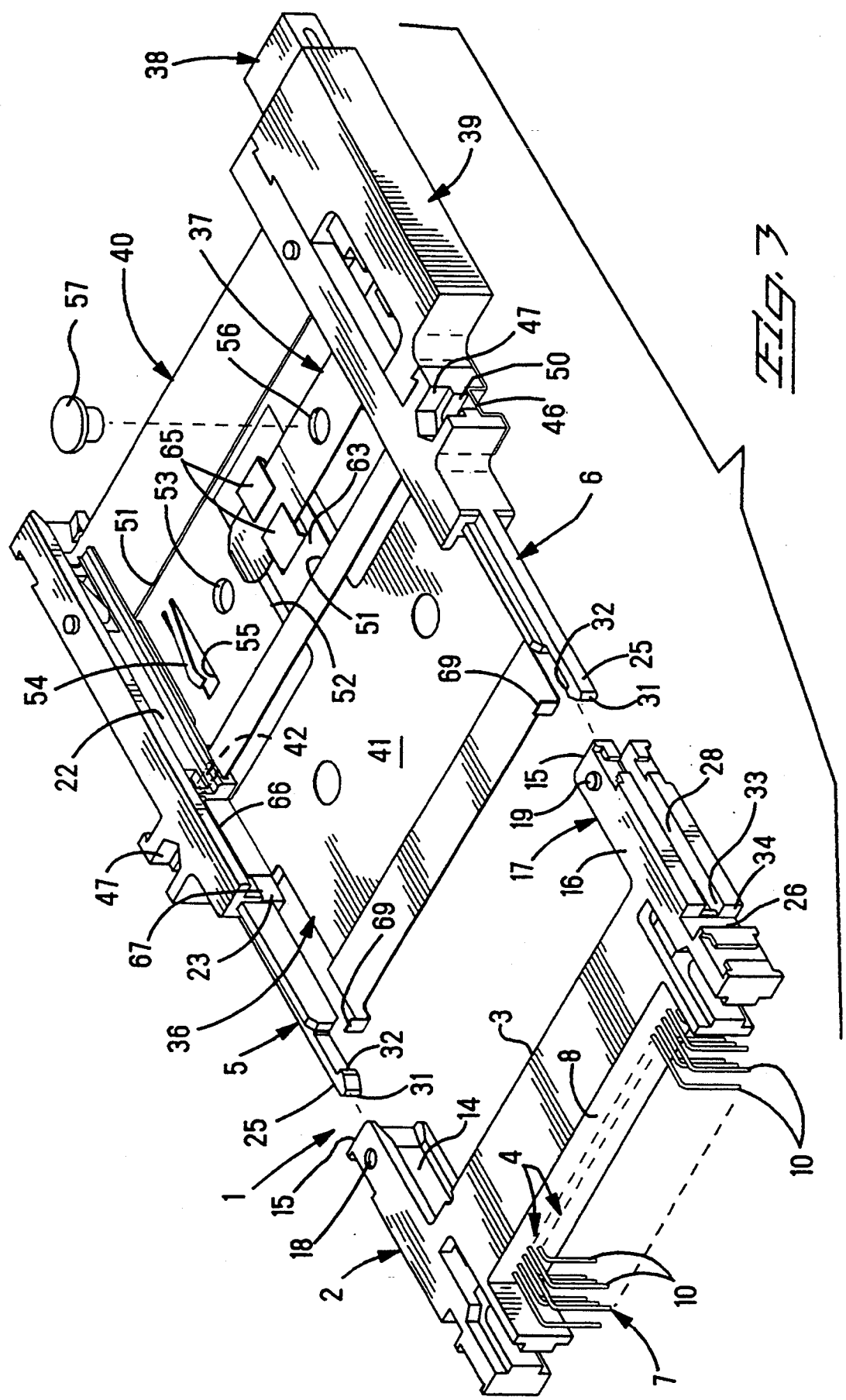
FIG. 3 is a view similar to FIG. 1, further illustrating an electrical connector with the structure shown in FIG. 1.

The prongs 25 lockingly engage in sockets 26, FIG. 3, the sockets 26 being in respective, exterior side surfaces 27 of the housing 2 flanking the mouth 3. The prongs 25 have respective cross sections that interfit slidably along grooves 28 in the respective, exterior side surfaces 27 of the housing 2. Ends of the prongs 25 have respective locking latches 31 with transverse, projecting fingers 32. The fingers 32 are forced to bend resiliently as they traverse in respective grooves 28, until the fingers 32 emerge from ends 33 of the grooves 28 and unbend to register against transverse latch shoulders 34 at the ends 32 of the grooves 28. Thereby, the prongs 25 lockingly engage the sockets 26.

With reference to FIGS. 1, 2 and 3, an eject mechanism 35 for ejecting the card 73 comprises; a sliding tray 36 between the guide arms 5, 6 that are spaced apart to receive opposite side edges 72 of the card 73, the guide arms 5, 6 being connected to the electrical connector 1, a lever arm 37 pivotally attached to the tray, a push button 38 engaging the lever arm 37, a housing 39 mounting the button 38 slidably on one of the guide arms 5, 6, and the tray 36 being engaged and moved by the lever arm 37 to urge the card 73 outwardly to project from the guide arms 5, 6 for grasping to remove the card 73 from the rails 5,6.

The tray 36 is constructed of a rear plate 40 and a front plate 41. With reference to FIGS. 2 and 3, the rear plate 40 is of unitary construction, stamped and formed from a sheet of metal. At a front of the rear plate 40, elongated ground contacts in the form of front support arms 42 extend forwardly, FIG. 6. The front support arms 42 extend into the grooves 22 of the guide arms 5, 6, and project beyond the grooves 22, and are inset within recesses 43 in the guide arms 5, 6. At a rear of the plate 40, laterally projecting, rear support arms 44, FIG. 6, extend into and beyond the grooves 22, and register in additional inset recesses 43 in the guide arms 5, 6.

Figure 6:
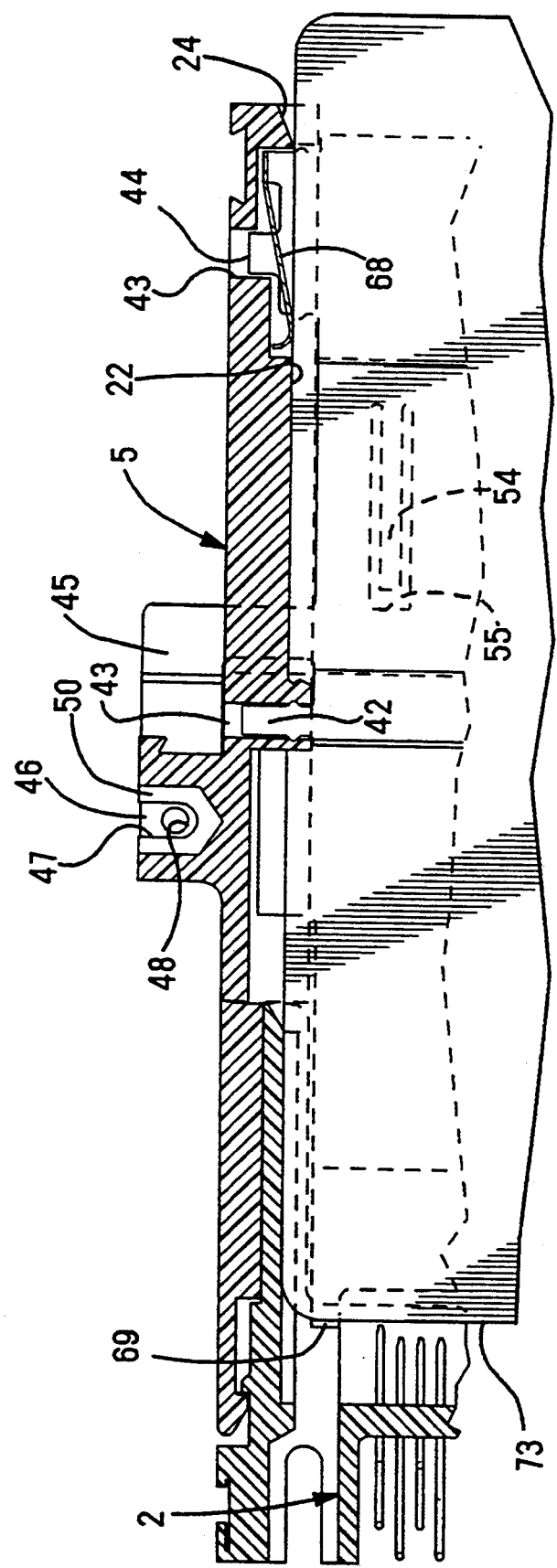
FIG. 6 is a fragmentary plan view in section of a portion of the structure shown in FIG. 5.

At least one ground contact 45, FIGS. 2 and 6, extends forwardly beside the guide arm 5. The ground contact 45 is bent with an offset portion 46 to nest in a vertical recess 47 in the guide arm 5. An opening 48 in the offset portion 46 receives a fastener 49 that is inserted along the recess 47 in the guide arm 5 and projects through a vertical opening in a flange 50 bridging across the recess 47. The fastener 49 secures the guide arm 5 to a circuit board, not shown. The fastener 49 is conductive and grounds the ground contact 45 to a ground plane, not shown, on the circuit board, not shown. Another ground contact 45 extends forwardly beside the guide arm 6. The ground contact 45 and the guide arm 6 are constructed similarly as is the ground contact 45 and the guide arm 5. The ground contact 45 and the guide arm 6 receive another fastener 49 for the purpose of grounding the ground contact 45 to a ground plane of a circuit board, not shown.

A bracket 64 at the rear of the rear plate 40 near each guide rail 5, 6 is bent to project upwardly from the plate 40. A resilient spring finger 68 on the bracket 64 projects forwardly and is bent to extend diagonally into a groove 22 of the associated guide arm 5 or the associated guide arm 6. The spring finger 68 has a curved end 69 that frictionally engages the ground plane 74 of the memory card 73. The bracket 64 electrically connects the ground plane 74 through each fastener to a ground plane on a circuit board, not shown.

Downward steps 51 are formed by creases in the front and the rear of the plate 40. The steps 51 lead to a central section of the plate 40. A central clearance opening 52 in the central section has an open front through a rise of the front step 51. Pivot openings 53 in the central section flank the clearance opening 52. Cantilever, resilient contact fingers 54 flank the clearance opening 52.

Edges on each contact finger 54 are defined by cutting the thickness of the plate 40 to define an opening 55 encircling the contact finger 54 on three sides. The contact fingers 54 are bent to project diagonally outward and upward from the openings 55 and from the thickness of the plate 40. The contact fingers 54 project into the space between the guide rails 5, 6 to engage the ground plane 74 of the card 73 when the card 73 is inserted into or withdrawn from the guide rails 5, 6.

The lever arm 37 is constructed of sheet metal. The lever arm 37 has a pivot 56 defined by a drawn eyelet with an opening. The eyelet itself is a pivot. The eyelet can receive an optional pivot pin 57 or rivet, for example. One end of the lever arm 37 is pivotally attached to one end of the push button 38. The pivot pin 58 has an embossed lump 59 that snaps into a recessed portion 61 in one end of the push button 38. The pivot pin has a rounded end to promote rotation in the recessed portion 61, alternatively; the lever arm 37 is attached by another pivot pin 58, FIGS. 4 and 5. The pivot pin 58 extends through an opening 59 in the lever 37 and is mounted in a recessed portion 60 of the push button 38. The push button 38 is slidably mounted in the molded plastic housing 39 of unitary construction.

Figure 4:
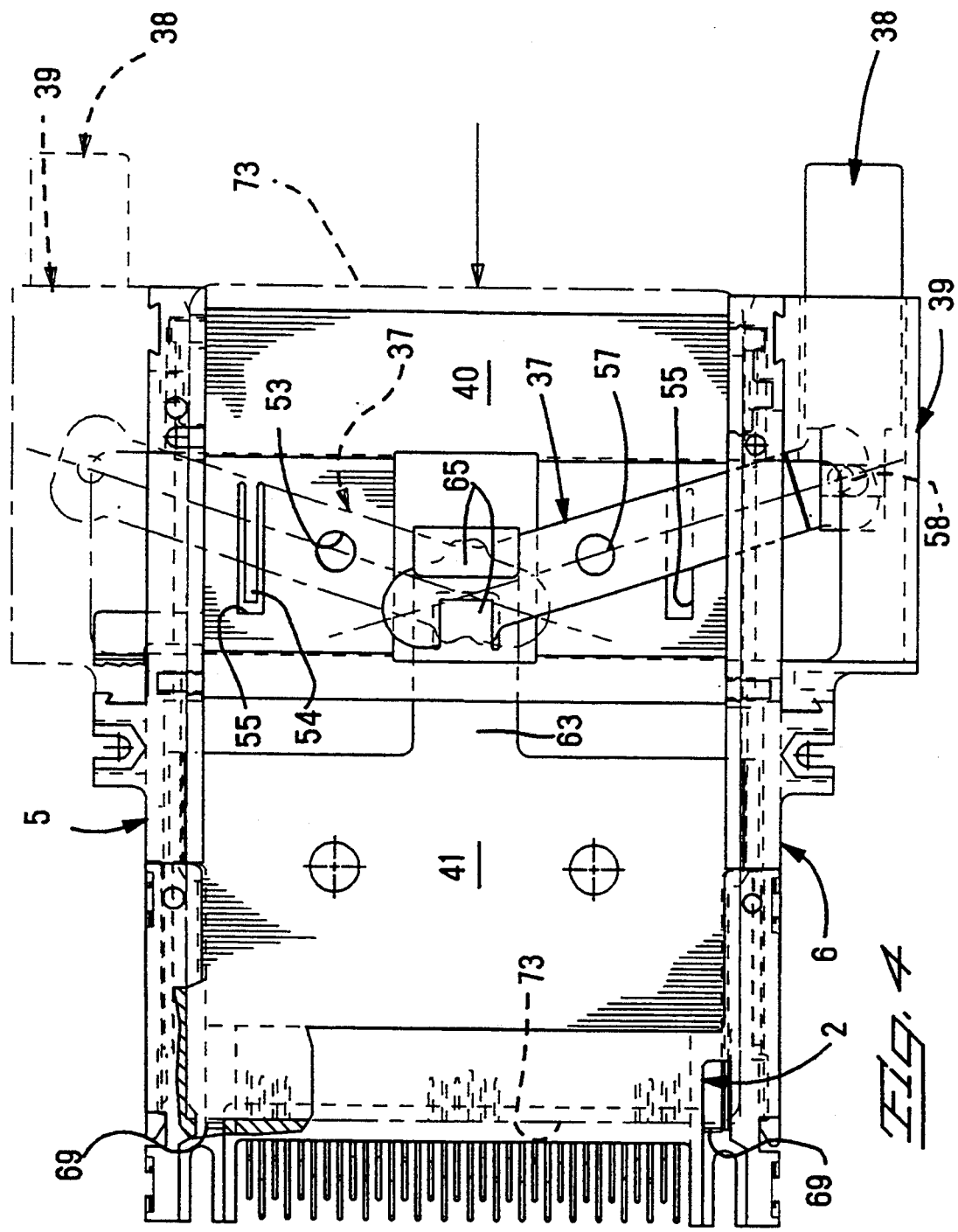
FIG. 4 is a top plan view of the structure shown in FIG. 3 illustrating alternative mounting locations for the card eject mechanism, and further illustrating the card in an inserted position.

The housing 39 and the push button 38 are adapted to mount to one side or the other of a card insertion path defined between the guide arms 5, 6. With reference to FIG. 4, both guide arms 5, 6 are formed with interlocking structure 61, interlocking with interlocking structure 62 on the housing 39 for mounting the housing 39 to one of the guide arms 5, 6. The interlocking structure 61 in FIGS. 1–5 comprises dovetail grooves. The interlocking structure 62 comprises projecting dovetail tongues. The housing 39 latches to the guide arm 6, or the guide arm 5 as shown in broken lines. The housing 39 can be inverted to face the dovetail tongues 62 toward the dovetail slots 61 of the guide arm 5. Opposite, inverted surfaces of the housing 39 are identical such that the housing 39 has the same appearance when inverted.

The interlocking structure 61 in FIGS. 1–6 comprises dovetail grooves. The interlocking structure 62 comprises projecting dovetail tongues. The housing 39 latches to the guide arm 6, or the guide arm 5 as shown in broken lines. The housing 39 can be inverted to face the dovetail tongues 62 toward the dovetail grooves 61 of the guide arm 5. Opposite, inverted surfaces of the housing 39 are identical such that the housing 39 has the same appearance when inverted.

Figure 7:
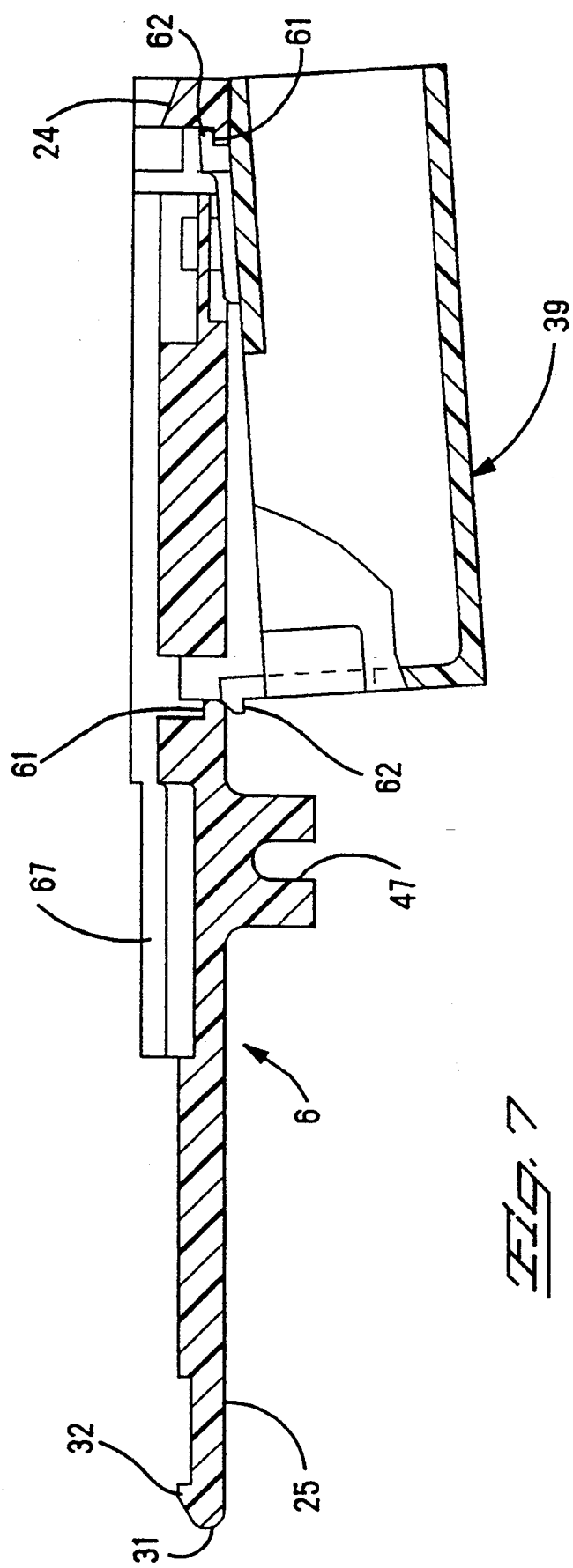
Figure 8:
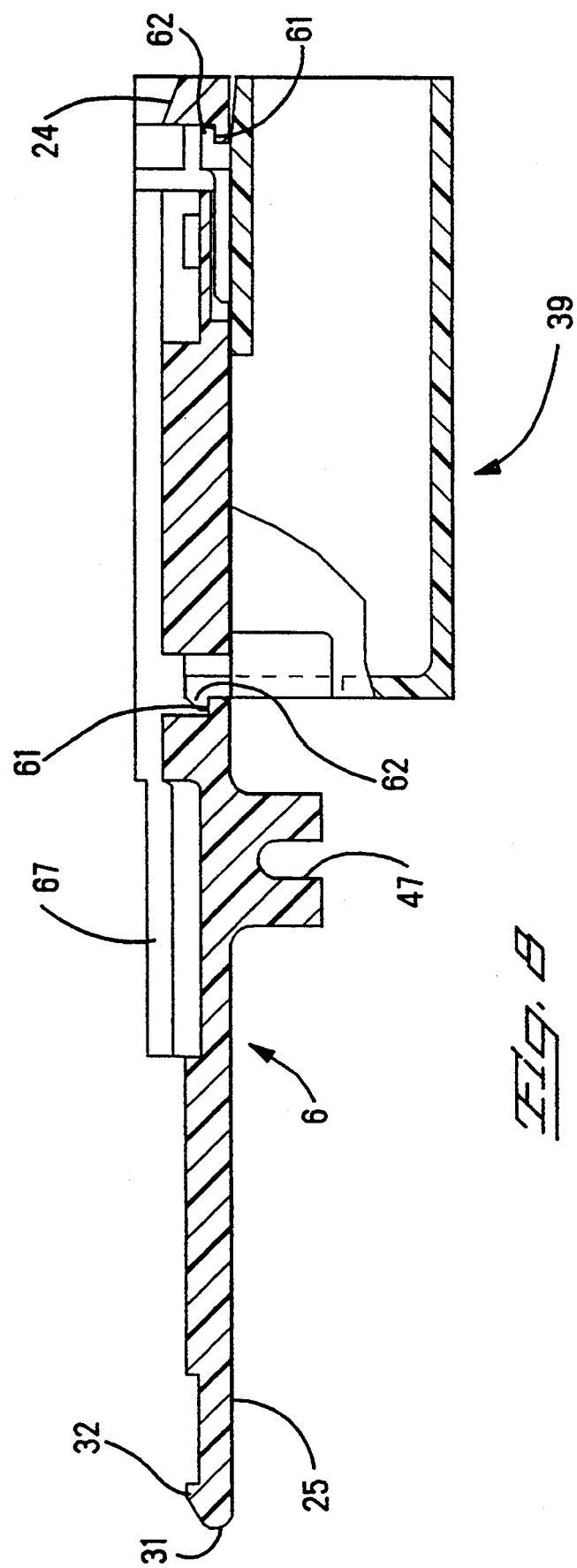

The interlocking structure 61 in FIGS. 7 and 8 comprises undercut grooves. The interlocking structure 62 in FIGS. 7 and 8 comprises projecting hooks, facing in opposite directions. The housing 39 latches to the guide arm 6, or the guide arm 5, in a manner as discussed with reference to FIGS. 7 and 8. A rear hook is hooked onto the rear undercut groove. Then the housing 39 is pivoted while the hook is hooked, FIG. 7, until the front hook enters the front undercut groove. The front hook deflects resiliently to enter the undercut groove. Once in the undercut groove, the front hook springs out to hook in the undercut groove, FIG. 8. The housing is then restrained from movement. The housing 39 can be inverted to face the hooks 62 toward the undercut grooves 61 of the guide arm 5. Opposite, inverted surfaces of the housing 39 are identical such that the housing 39 has the same appearance when inverted.

The lever arm 37 extends over the rear plate 40 of the tray 36. The finger 54 nearer to the housing 39 is removable to avoid engagement with the lever arm 37. The second conductive finger 54 remains on the tray 36 to contact the card 73 received by the guide rails 5,6 when the first finger 54 has been removed. The lever arm 37 extends over the opening 55 from which the finger 54 has been removed.

As shown in FIGS. 2, 3 and 4, the front plate 41 of unitary construction is stamped and formed from a sheet of metal. A rearward extending link arm 63 passes under the front step 51 of the rear plate 41 and into the opening 52 in the rear plate 41. A pair of tabs 65 are bent out of the thickness of the link arm 63 and grasp the end of the lever arm 37 that extends over the opening 52.

Support arms 66 on the front plate 41 are formed with folds. The support arms 66 project laterally to register against the inside surfaces 23 of the guide arms 5, 6. The surface 23 is inwardly stepped to recess the arms 66 away from the card receiving grooves 22. The arms 66 are supported slidingly on ledges 67 of the guide arms 5, 6 and slidingly traverse on the ledges 67. Upstanding stops 69 are on a front of the front plate 41. The stops 69 are bent upward from the remainder of the plate 41.

Figure 5:
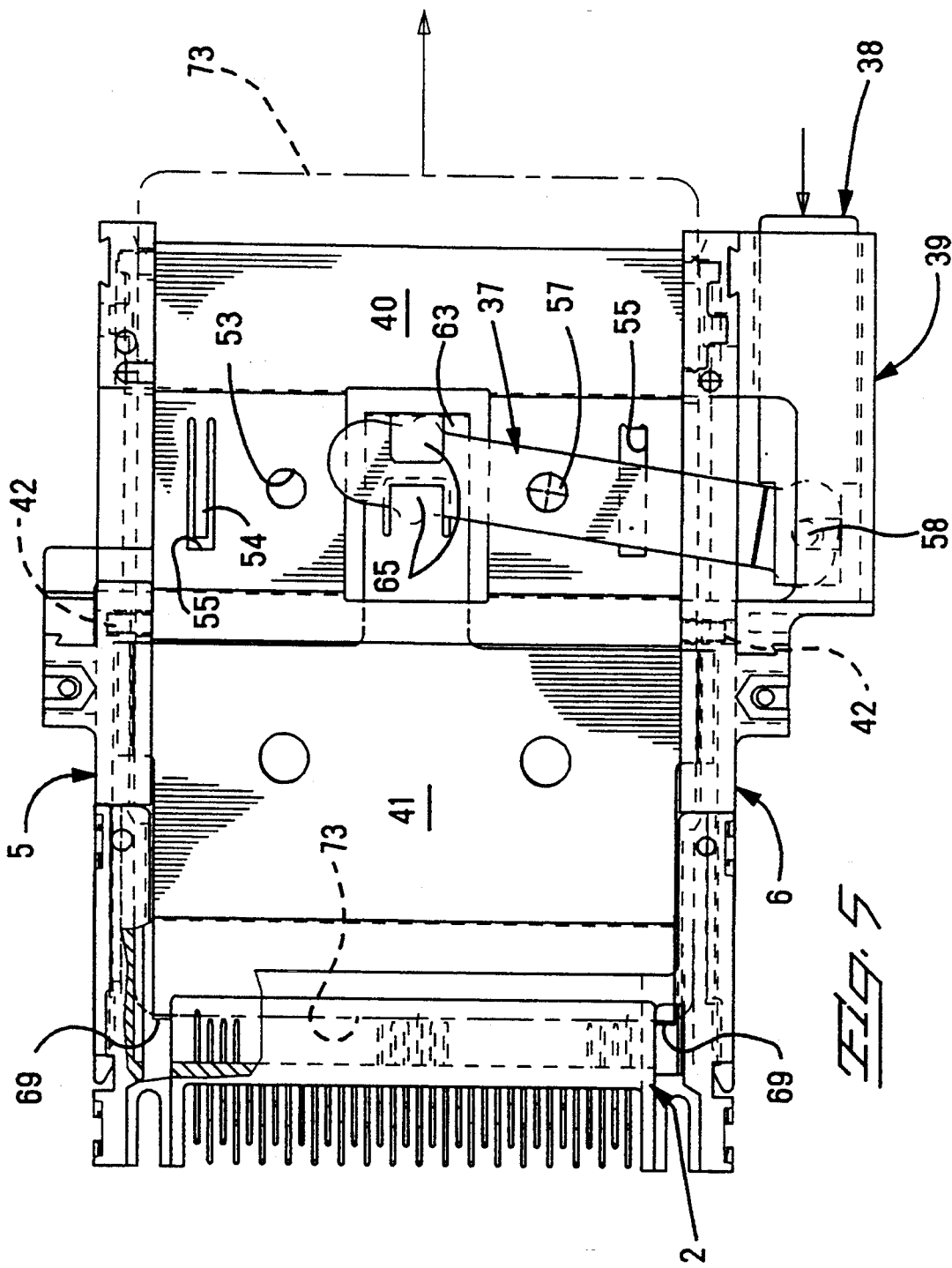
FIG. 5 is a view similar to FIG. 4 illustrating an ejected position of the card.

With reference to FIG. 5, when the card 73 is inserted along the guide arms 5, 6, the tray receives the card 73. As the card 73 continues to move forward, the card 73 engages the stops 69 and slidingly moves the front plate 41 forward. Movement of the front plate 41 forward causes the lever arm 37 to pivot, and causes the push button 38 to move in a rearward direction to project further outward from the housing 39. The card 73 is fully inserted as shown in FIG. 4, and when the front of the card 73 is received in the mouth 3 of the connector 1. To eject the card 73 to a position shown in FIG. 5, the push button 38 is pushed further into the housing 39. As the push button 38 moves forwardly, the lever arm 37 pivots clockwise as shown in FIG. 5, the front plate 41 moves rearward, and the stops 69 impel the card 73 rearward. The card 73 protrudes from the rear plate 40 and can be removed.

The card 73 is positioned as shown in FIG. 5, either for further insertion or for removal. EMI and ESD protection of the card 73 is maintained by engagement of the fingers 68, 54 with the ground plane 74 on the card 73 while the card 73 is positioned as shown in FIG. 5.

According to an advantage of the invention, a card ejecting mechanism 35 is constructed to be mounted to one side or the other of a card receiving device of a card reader. According to another advantage of the invention, conductive fingers 54, 68 of a card ejecting mechanism 35 provide EMI and ESD protection for a card 73, and either one or the other of the fingers 54 is removable to avoid engagement with moving parts of the mechanism that is mounted to one side or the other of a card receiving device.

Other embodiments of the invention and modifications of the invention are intended to be covered by the spirit and scope of the claims defining the invention.

We claim:

1. A card ejecting mechanism, comprising: a sliding tray between guide arms spaced apart to receive opposite side edges of a card, the guide arms being connected to an electrical connector, a lever arm pivotally attached to a plate extending between the guide arms, a push button slidably engaging the lever arm, a housing mounting the button slidably on one of the guide arms, the tray being engaged and moved by the lever to urge the card outwardly from the guide arms for grasping to remove the card from the guide arms, and a first conductive finger on the plate projecting to contact a card received by the guide arms, both guide arms being formed with interlocking structure for mounting the housing, the housing being mounted by the interlocking structure to one of the guide arms, the plate being formed with a second conductive finger to contact a card received by the guide arms, and one of the fingers nearer to the housing than the other of the fingers being removable to avoid engagement with the lever arm.

2. A card ejecting mechanism as recited in claim 1, comprising: ground contacts on the plate extending along the guide arms to contact edges of a card received by the guide arms.

3. A card ejecting mechanism as recited in claim 1, comprising: at least one first ground contact on the plate nesting with a passage in one of the guide arms, and the first ground contact being adapted with openings to receive a circuit board fastener extending along the passage.

4. A card ejecting mechanism as recited in claim 1, comprising:
tabs on the plate overlapping the lever arm.

5. A card ejecting mechanism as recited in;claim 1, comprising: sliding arms on the plate slidingly mounted to the guide arms.

6. A card ejecting mechanism as recited in claim 1, comprising: the housing and the push button being adapted to mount to one side or the other of a card insertion path defined between the guide arms.

7. A card ejecting mechanism, comprising: a sliding tray between guide arms spaced apart to receive opposite side edges of a card, the guide arms being connected to an electrical connector, a lever arm attached to the tray, a push button slidably engaging the lever arm, a housing mounting the button slidably on one of the guide arms, the tray being engaged and moved by the lever to urge the card outwardly from the guide arms for grasping to remove the card from the guide arms, at least one first ground contact on the tray nesting with a passage in one of the guide arms, both guide arms being formed with interlocking structure for mounting the housing, the housing being mounted by the interlocking structure to one of the guide arms, the tray being formed with first and second conductive fingers, and one of the conductive fingers being nearer to the housing than the other of the conductive fingers, and being removable to avoid engagement with the lever arm.

8. A card ejecting mechanism as recited in claim 7, comprising:
tabs on the tray overlapping the lever arm.

9. A card ejecting mechanism as recited in claim 7, comprising: sliding arms on the tray slidingly mounted to the guide arms.

10. A card ejecting mechanism as recited in claim 7, comprising: the housing and the push button being adapted to mount to one side or the other of a card insertion path defined between the guide arms.

11. A card ejecting mechanism comprising: a sliding tray between first and second guide arms spaced apart to receive opposite edges of a card, the guide arms being connected to an electrical connector to receive the card, a lever arm pivotally attached to a plate extending between the guide arms, the lever arm being pivotable over the plate to move the sliding tray, a push button engaging the lever arm, a housing mounting the push button slidably on either the first or the second of the guide arms, and first and second conductive fingers in respective openings in the plate, each of the fingers being adapted to project from a corresponding one of the respective openings that is uncovered by the lever arm to contact a card received by the guide arms, the lever arm extending over a first of the respective openings that is nearer to the housing than a second of the respective openings, the second of the respective openings being uncovered by the lever arm, and the second finger being in the uncovered second of the respective openings and projecting outwardly of the uncovered second of the respective openings to contact a card received by the guide arms.

12. A card ejecting mechanism as recited in claim 11, comprising: interlocking structure on the guide arms to interlock with the housing.

13. A card ejecting mechanism as recited in claim 11, comprising: ground contacts on the plate extending along the guide arms to contact a card received by the guide arms.

14. A card ejecting mechanism as recited in claim 11, comprising: at least one first ground contact on the plate nesting with a passage in one of the guide arms, and the first ground contact being adapted with openings to receive a circuit board fastener extending along the passage.

15. A card ejecting mechanism as recited in claim 11, comprising: sliding arms on the tray slidingly mounted to the guide arms.

* * * * *